United States Patent [19]
Boles

[11] Patent Number: 5,168,511
[45] Date of Patent: Dec. 1, 1992

[54] MANCHESTER DATA RECORDER WITH SYNCHRONOUSLY ADJUSTABLE CLOCK

[75] Inventor: Glenn Boles, Fords, N.J.

[73] Assignee: Berkeley Varitronics Systems, Inc., Metuchen, N.J.

[21] Appl. No.: 600,621

[22] Filed: Oct. 22, 1990

[51] Int. Cl.[5] ............................................. H03M 5/12
[52] U.S. Cl. ..................................... 375/82; 327/307; 375/87; 375/110
[58] Field of Search ...................... 375/55, 81, 82, 87, 375/95, 110, 119; 360/40, 42; 341/70; 329/309; 364/746

[56] References Cited

U.S. PATENT DOCUMENTS

| | | | |
|---|---|---|---|
| 3,728,484 | 4/1973 | Hawkey et al. | 375/82 |
| 4,267,680 | 5/1981 | Bond et al. | 364/746 |
| 4,292,626 | 9/1981 | Smithlin | 341/70 |
| 4,584,695 | 4/1986 | Wong et al. | 341/70 |
| 4,608,702 | 8/1986 | Hirzel | 375/87 |
| 4,868,569 | 9/1989 | Montgomery | 341/70 |
| 5,003,562 | 3/1991 | Driest et al. | 375/87 |

Primary Examiner—Benedict V. Safourek
Attorney, Agent, or Firm—Robert A. Green

[57] ABSTRACT

A synchronous digital decoding circuit decodes Manchester-encoded data using a clock regenerating circuit which produces a decoding clock that is continuously adjusted in accordance with detected phase deviations in the received data signal. The Manchester-encoded data are transmitted with high-to-low and low-to-high transitions at the centers of the data bit cells. On the receiving end, a digital state machine, which is coupled to a timer/counter unit, detects whether a transition is on-time, early, or late in each bit cell as compared with the established decoding clock. If the transition is early or late, the state machine produces a correction signal which is used to correspondingly shorten or lengthen the clock count by a predetermined incremental amount. The adjustment of the clock counts on an ongoing basis reduces or eliminates the phase deviation and prevents the accumulation of phase error over an extended length of time. In the preferred embodiment, an oscillator input of 1.2 MHz is provided to a Mod 12 counter having its output coupled to a Mod 10 counter. The 100 KHz output of the Mod 12 counter is provided to the Mod 10 counter, and the Mod 10 counter normally counts out at 10 clock units (120 oscillator pulses) per bit cell, in order to generate a decoding clock of 10 KHz frequency for a data rate of 10K bits/sec. The incremental time adjustment is preferably in the range of 1-6 oscillator pulses out of 120 oscillator pulses for a bit cell. The original NRZ data can then be recovered by using the adjusted regenerated clock.

13 Claims, 5 Drawing Sheets

MANCHESTER DATA RECORDER WITH SYNCHRONOUSLY ADJUSTABLE CLOCK

FIELD OF INVENTION

The present invention relates to a decoding circuit for Manchester-encoded data, and particularly, to a decoding circuit having a synchronously adjustable clock.

BACKGROUND OF INVENTION

Figure 1:
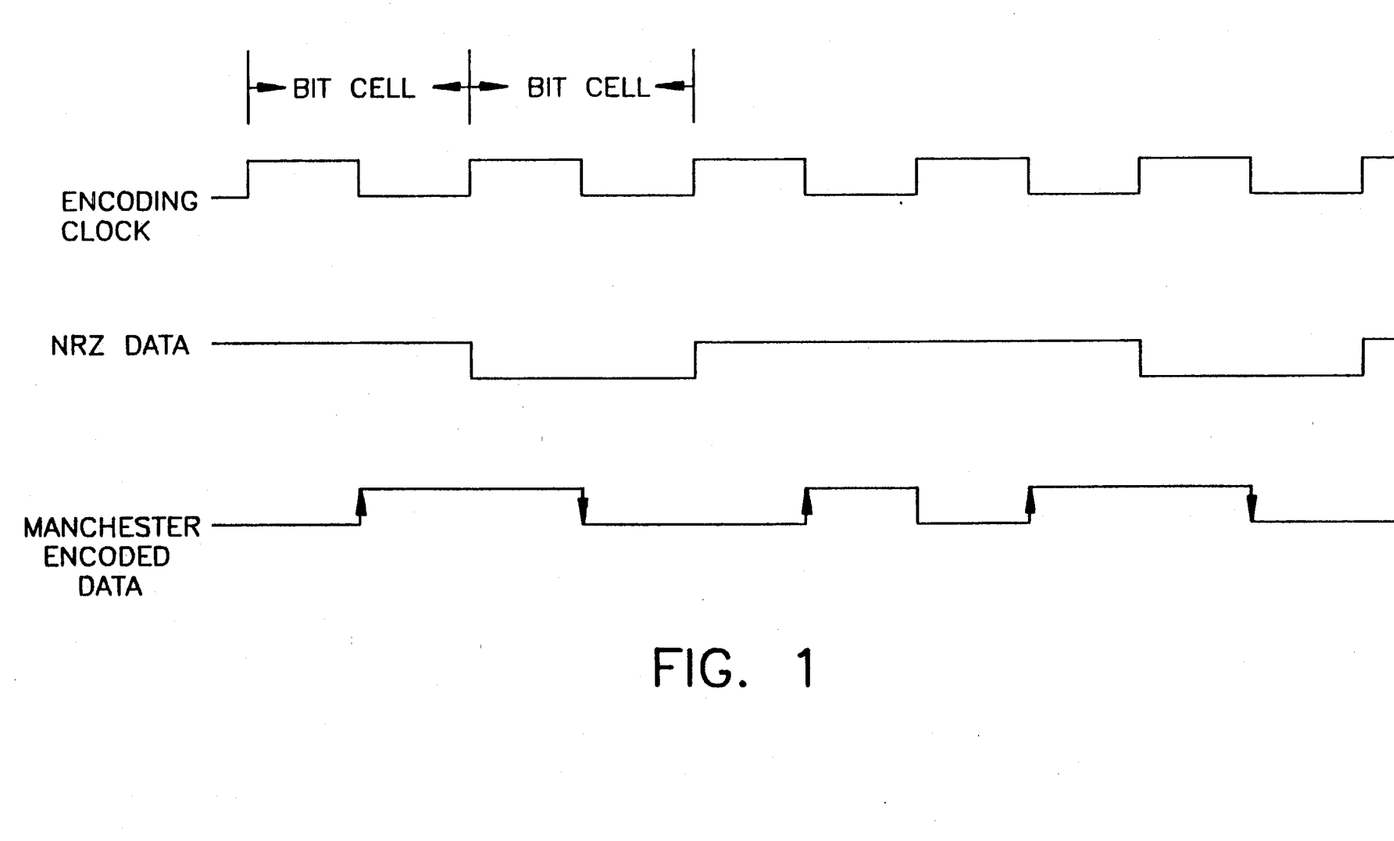
FIG. 1 is a waveform diagram showing an example of Manchester encoding using an encoding clock in phase with binary data in NRZ format.

Manchester encoding is a technique of encoding serial binary data to be transmitted between synchronous communication systems. Referring to FIG. 1, the binary data is typically in NRZ (non-return to zero) format in which a high level indicates a "1" bit and a low level indicates a "0" bit. The data is encoded with an encoding clock usually by Exclusive Or-ing rectangularwave clock pulses which are in phase with the bit cells of the NRZ data. This encoding process produces a transition in the center of each bit cell. That is, a data bit of "0" will be encoded as a high-to-low level transition in the center of the bit cell, and a data bit of "1" will be encoded as a low-to-high level transition at the bit center. The continuous encoding of binary data bits will produce an encoded data stream having positive or negative transitions for each bit transmitted.

The overall system must transmit a pattern that will insure the proper recovery of the binary data with a low bit rate error at the receiving end. At the beginning of a transmission of data, the system typically transmits a "dotting" pattern of alternate 1's and 0's for a short period of time in order to establish the phase of the encoding clock. This dotting pattern has a frequency of one-half the clock frequency, so that the encoded data have transitions only in the centers of the respective bit cells. The transmitted dotting pattern allows the receiving system to establish a decoding clock which is ideally in phase with the encoding clock. The decoding clock is then used to decode the transmitted data back into NRZ format usually by Exclusive Or-ing with the encoded data.

However, in the course of transmission, noise and path interferences or distortions can cause the received encoded data to deviate from the phase of the decoding clock initially established by the dotting pattern. As the phase errors accumulate, the transitions of the Manchester-encoded data can deviate quite far from the centers of the bit cells, thereby leading to errors in recovery of the binary data.

As one example of an application for Manchester encoding/decoding of binary data, the wideband output of an FM receiver discriminator in a cellular radio telephone contains voice signals and supervisory audio tones which are time multiplexed with 10 Kb/s Manchester-encoded control signals. A Manchester logic "1" level is represented by fo+8 khz and a "0" level by fo−8 khz. The data is used for such functions as establishing the cell-to-mobile connection and for radio channel selections. However, the cellular radio environment is replete with noise, Doppler shifts, reflections, and problems with discriminator linearity, so that simply Exclusive Or-ing the regenerated decoding clock with raw Manchester data will not provide data recovery at acceptably low error rates.

SUMMARY OF INVENTION

It is therefore a principal object of the invention to provide a decoding circuit which can adjust to phase deviations in the transmission of Manchester-encoded data. It is a specific object to provide a decoding circuit which has means for tracking and eliminating phase deviations in the data bit cells of the received data signal.

In accordance with the invention, a synchronous digital decoding circuit decodes Manchester-encoded data using a clock regenerating circuit which produces a decoding clock that is continuously adjusted in accordance with detected phase deviations in the received data signal. The Manchester-encoded data are transmitted with high-to-low and low-to-high transitions at the centers of the data bit cells. On the receiving end, a digital state machine, which is coupled to a timer/counter unit, detects whether a transition is on-time, early, or late in each bit cell as compared with the established decoding clock. If the transition is early or late, the state machine produces a correction signal which is used to correspondingly shorten or lengthen the clock count by a predetermined incremental amount so that the next bit cell has its transition restored toward the center time position of the bit cell. The adjustment of the clock counts on an on-going basis reduces or eliminates the phase deviation and prevents the accumulation of phase error over an extended length of time.

In the preferred embodiment, an oscillator input of 1.2 MHz is provided to a Mod 12 counter having its output coupled to a Mod 10 counter. The 100 KHz output of the Mod 12 counter is provided to the Mod 10 counter and the state machine. The Mod 10 counter normally counts out at 10 clock units (120 oscillator pulses) per bit cell, in order to generate a decoding clock of 10 KHz frequency for a data rate of 10K bits/sec. The state machine detects whether the transition in the current cell is early or late from the center of the current bit cell and, if so, correspondingly outputs a correction signal to the Mod 12 and/or Mod 10 counter to shorten or lengthen the time-out count for the bit cell by an incremental amount. The incremental time adjustment is preferably in the range of 1–6 oscillator pulses out of 120 oscillator pulses for a bit cell. The state machine continues to adjust the time-out counts for successive bit cells until the detected transition is on-time, i.e., in phase, with the center of the bit cell. The invention thus regenerates a decoding clock that is continuously adjusted to be phase-coherent with the received data signal. The original NRZ data can then be recovered by using the regenerated clock for Exclusive Or-ing with the received data signal or comparable decoding technique.

BRIEF DESCRIPTION OF DRAWINGS

The above objects and further features and advantages of the invention are described in detail below in conjunction with the drawings, of which.

DETAILED DESCRIPTION OF PREFERRED EMBODIMENTS

Figure 2:
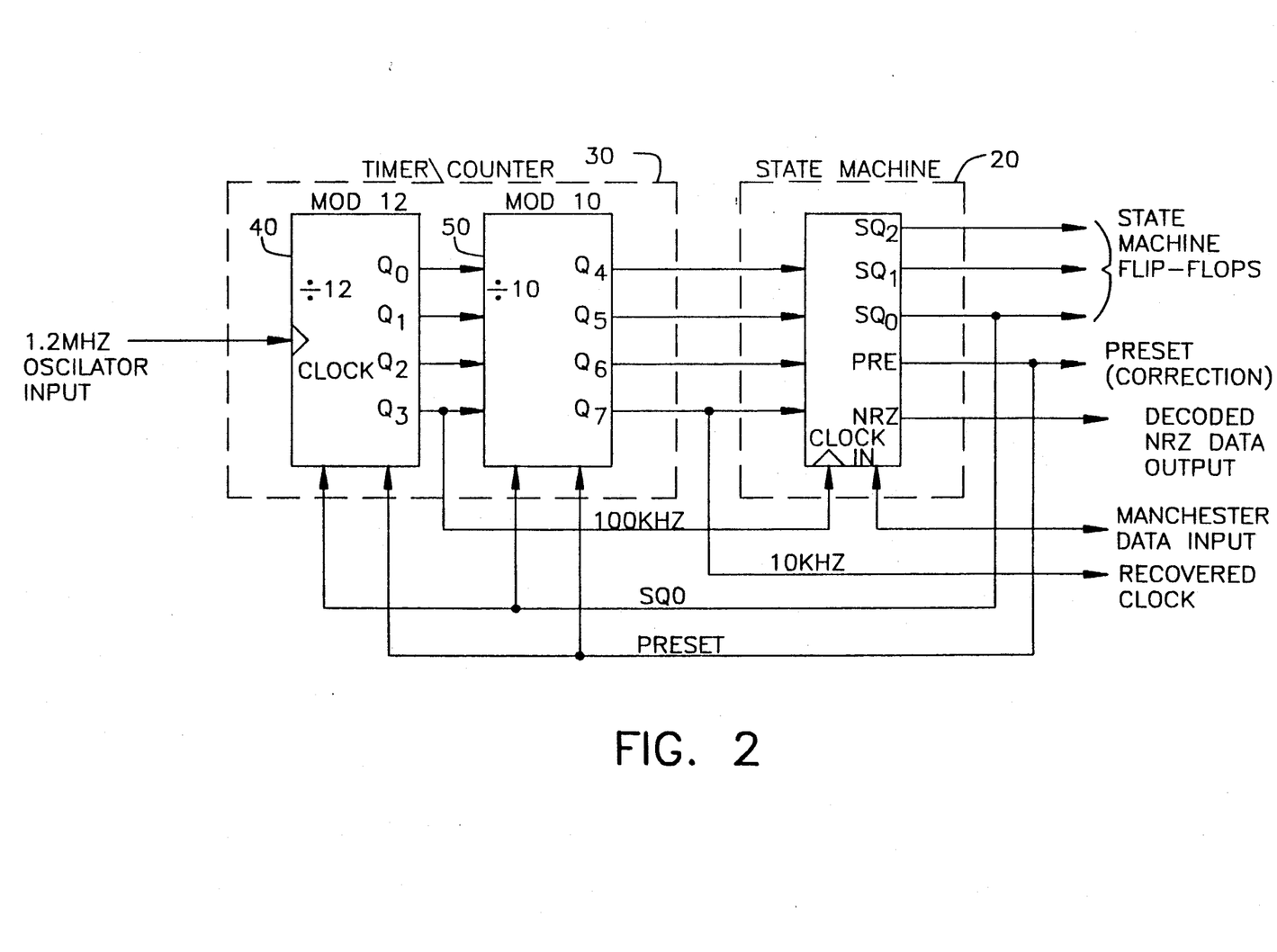
FIG. 2 is a schematic diagram of a synchronous digital decoding circuit incorporating a clock regenerating circuit for regenerating a continuously adjusted decoding clock from the received Manchester-encoded data in accordance with the invention.

In accordance with the general principles of the invention, a synchronous digital decoding circuit decodes Manchester-encoded data using a clock regenerating circuit which produces a decoding clock that is continuously adjusted in accordance with detected phase deviations in the received data signal. Referring to FIG. 2, the decoding circuit includes a digital state machine 20 coupled to a two-stage timer/counter unit 30 which receives a high frequency oscillator input. In the embodiment shown, the oscillator input of 1.2 MHz is provided to a modulo 12 counter, which normally counts out at 12 oscillator pulses, in order to provide a clock output Q3 at 100 KHz frequency to a modulo 10 counter. The count outputs Q0, Q1, Q2 of the Mod 12 counter are provided as inputs to the Mod 10 counter. The 100 KHz clock output of the Mod 12 counter is also provided to the clock input of the state machine 20. The Mod 10 counter normally counts out at 10 clock increments (120 oscillator pulses) per bit cell, in order to generate a decoding clock output Q7 of 10 KHz frequency. The count outputs Q4, Q5, Q6 of the Mod 10 counter are provided as inputs to the state machine. The decoding clock output Q7, as adjusted by the state machine (to be described hereinafter), is the recovered decoding clock which is used for decoding the received Manchester-encoded data into an NRZ data output. Logic tables for the counts, outputs, and count values of the timer/counter units are shown in Table A below.

Figure 3A:
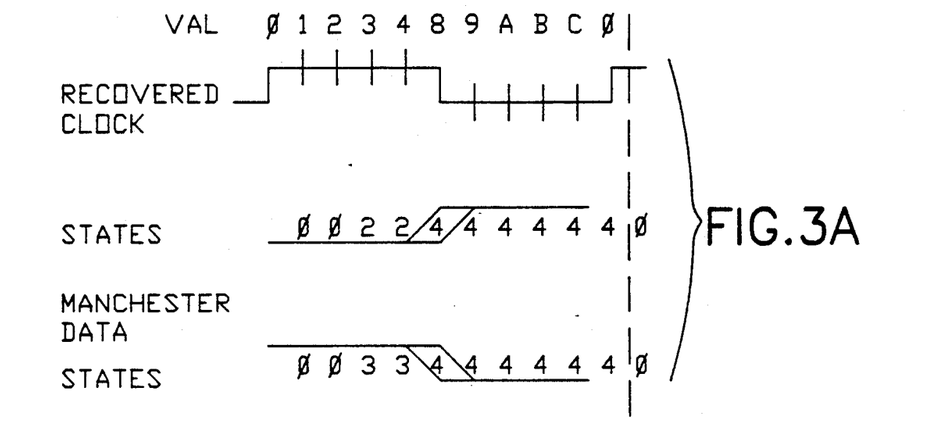
FIGS. 3A, 3B, and 3C illustrate the detection of phase deviations in the bit transitions of the received encoded data and the resulting adjustment of the clock count for the respective bit cells in accordance with the invention.
Figure 3B:
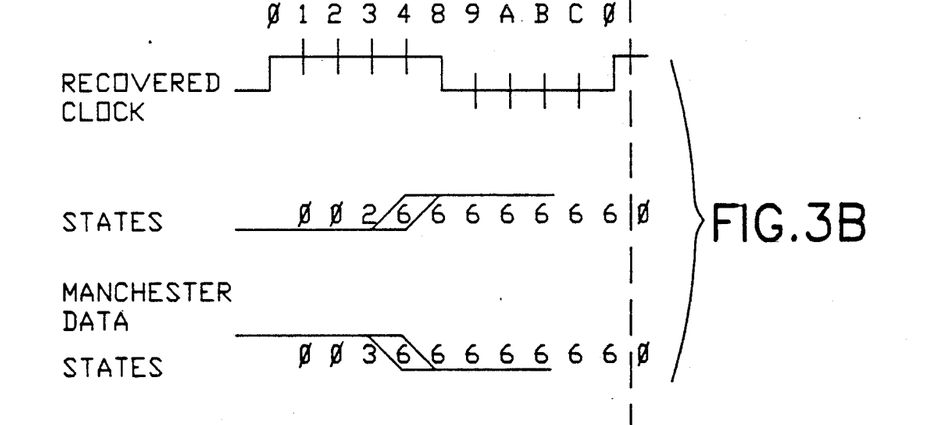
Figure 3C:
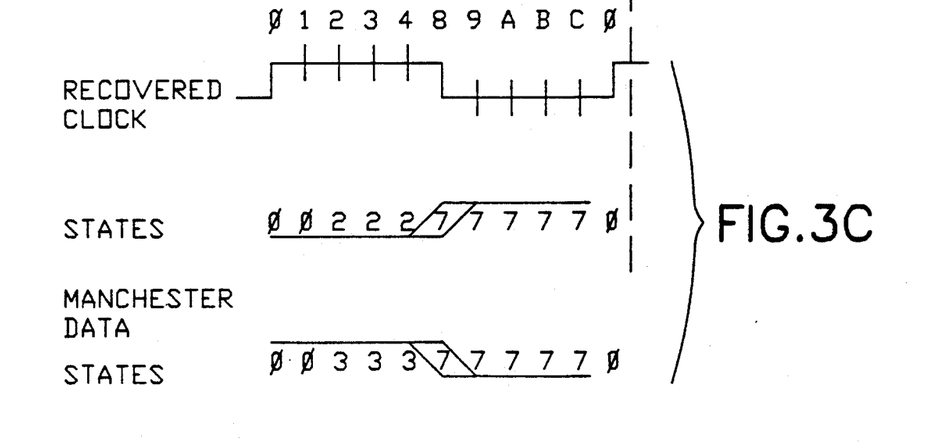

As shown schematically in FIGS. 3A-3C, the state machine 20 looks at the raw Manchester-encoded data compared to the 10 clock increment count from the outputs Q4, Q5, Q6 of the Mod 10 counter for each bit cell. The count values of the Mod 10 counter are arbitrarily represented as "0, 1, 2, 3, 4, 8, 9, A, B, C" in each bit cell. The incoming transition of the Manchester data signal is detected by the state machine and a decision is made as to how to adjust the locally generated clock. Three possible decisions can be made. The first case is shown in FIG. 3A when the bit transition occurs at the center of the bit cell, between states "4" and "8", and therefore no correction of the clock is required. The second case is shown in FIG. 3B when the bit transition happens earlier then expected, for example, between the states "3" and "4", which indicates that the bit transition leads the center position of the bit cell and therefore requires that the clock count for the bit cell should be shortened. The third case is shown in FIG. 3C when the bit transition happens later than expected, for example, between states "8" and "9", which indicates that the bit transition lags the center position of the bit cell and therefore requires that the clock count for the bit cell be lengthened.

The state machine 20 outputs two signals back to the modulo counters, Preset and SQ0. The Preset output signal is only valid in the second and third cases which require clock corrections, and the SQ0 signal determines which type of clock correction to make, i.e., either shortening the clock count for the next bit cell (transition is early) or lengthening it (transition is late).

The bit cell count is shortened or lengthened by a predetermined incremental amount which is selected such that the clock adjustment will not overshoot typical values of phase deviation for the applied communications environment, and thereby lead to unstable swings ("jitter") in the correction cycles. On the other hand, the correction amount should not be too short, in order that correction of the phase deviation not take too long a time. For the cellular radio environment, the incremental time adjustment is preferably in the range of 1-6 oscillator pulses out of 120 oscillator pulses for a bit cell, which is about 1/120 to 1/20 of the length of a bit cell, or about 1/12 to ½ of a bit cell count increment. In the example shown, the preferred time adjustment is selected to be about 4 oscillator pulses, which is about 1/30 the length of a bit cell, or about ⅓ of a bit cell count increment. The correction amount is added or subtracted in the last count increment "C" of the bit cell. Small phase deviations may be corrected in a single correction cycle, whereas larger phase deviations will be corrected over a number of bit cells. The state machine continues to adjust the time-out counts for successive bit cells until the detected transition is in phase with the center of the bit cell.

The state machine 20 has as its inputs the raw Manchester-encoded data signal and the outputs of the two-stage timer/counter 30. The state machine coding as well as the configuration of the Mod 12 and 10 counters are optimized to allow the clock regenerating logic to be implemented in two standard 16R8 PAL chips. The Mod 12 counter is driven from a very accurate and stable 1.2 MHz TCXO oscillator, such as used as a timebase for a frequency synthesizer in the front end of a cellular receiver. This 1.2 MHz oscillator is phase-coherent to the carriers of typical cellular channels. By changing only the the logic equations of the system Mod 12 counter can be changed to a Mod 15 counter, the American AMPS standards can be converted to the European TACS standards (8 KHz).

Figure 4:
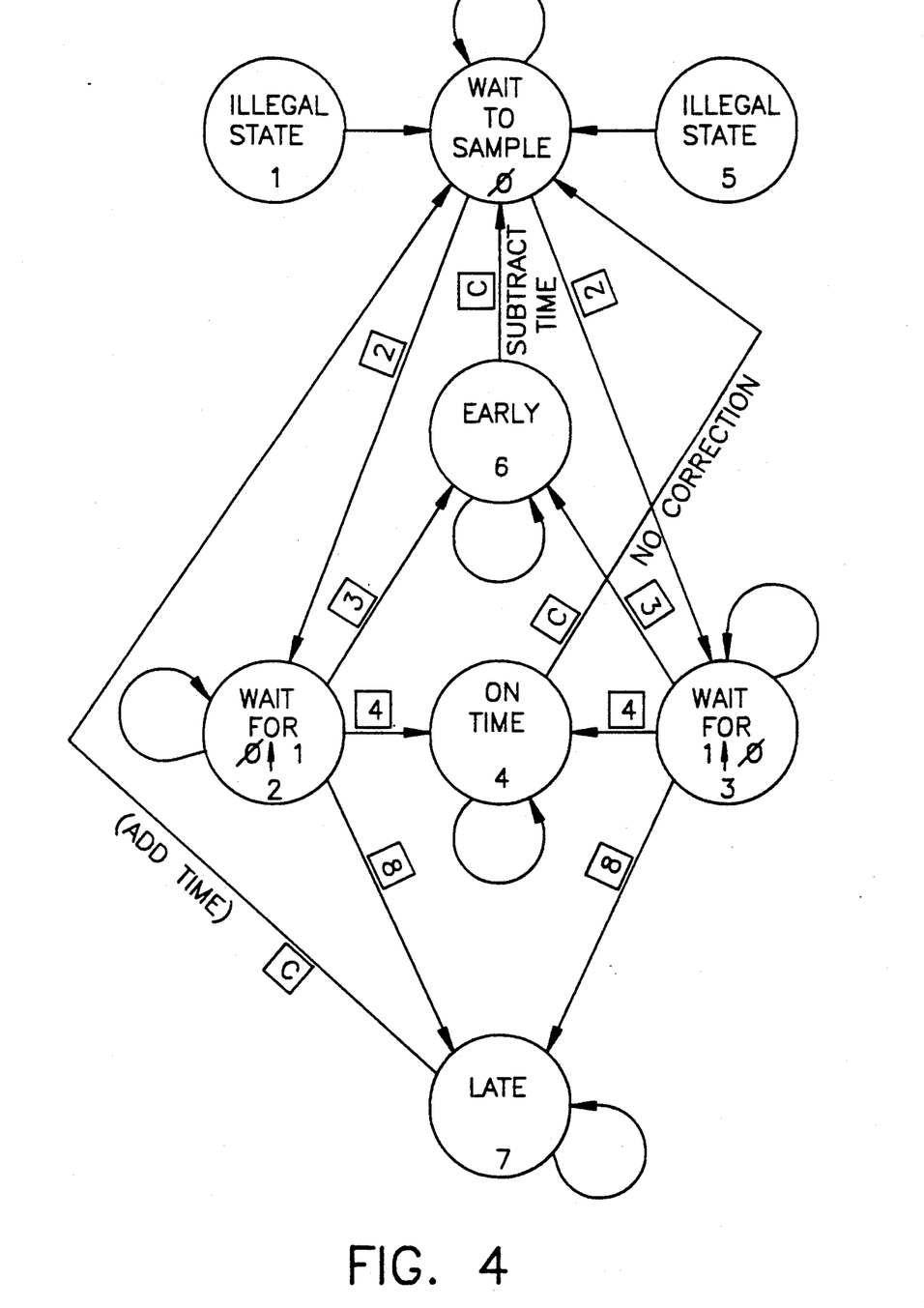
FIG. 4 is a state diagram illustrating the various states of a preferred form of state machine used in the clock regenerating circuit of FIG. 2.

Referring to FIG. 4, a preferred form of the state machine consists of 8 unique states, 6 of which are used for the regeneration of the phase-coherent 10 KHz Manchester clock and two unused or illegal states. The states of the state machine 20 are indicated by the numbers in the circles of the diagram. The timer count values from the Mod 10 counter to the state machine are indicated by the numbers in the squares along the arrows which indicate changes of state. While in State 0, the, machine waits for a timer count value of "2" from the Mod 10 counter/timer at which time it samples the Manchester data signal. If this signal is presently a logic 1, the machine advances to State 3, whereas if it is a logic 0, the machine advances to State 2. Once in State 2, the machine waits for a 0-to-1 logic transition of the raw Manchester data signal and changes state depending upon a determination if this transition is either ON TIME (State 4), EARLY (State 6), or LATE (State 7) as indicated by the Mod 10 count value ("4", "3", or "8", respectively) for the bit cell at the time of transition. The same is true if the machine is presently in State 3, with the exception of the polarity of the Manchester data signal. While in either State 4 (ON TIME), State 6 (EARLY), or State 7 (LATE), the state machine waits for the Mod 10 timer to reach a count value of "C" (count of 10 clock units) and issues the preset instructions to the Mod 12 and Mod 10 timers to make a correction in the bit cell clock count. If the state machine determined that the data signal was ON TIME, no correction is made, if EARLY, the timer count is shortened, and if LATE, the timer count is extended.

Figure 5:
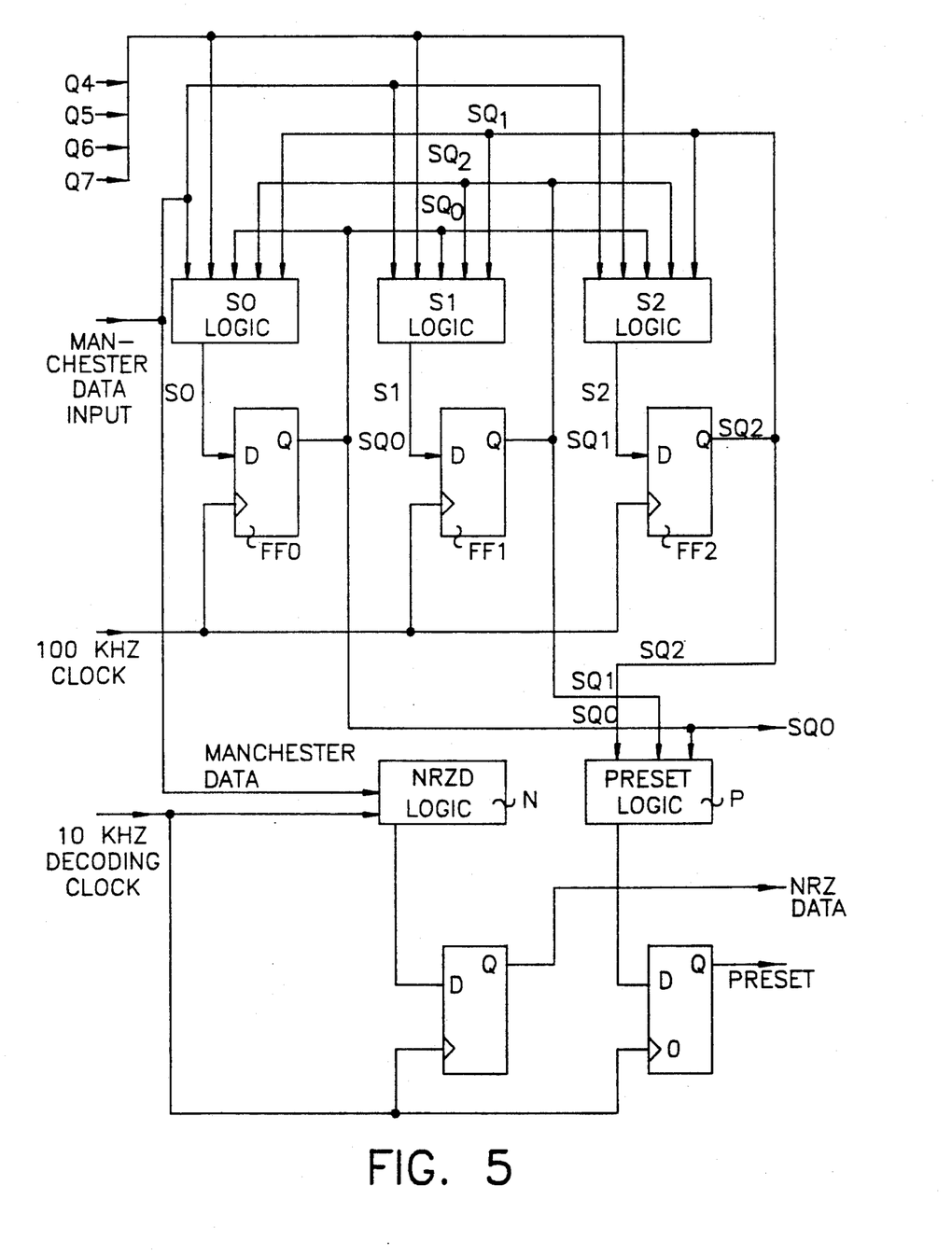
FIG. 5 is a logic diagram of a preferred implementation of the state machine of FIGS. 2 and 4.

In FIG. 5, a logic implementation of the state machine 20 is shown having the outputs Q4, Q5, Q6, Q7 of the Mod 10 counter fed to the logic units S0, S1, S2. The logic unit S0 has an output signal S0 which is latched to the flip-flop FF0, and likewise logic unit signal S1 to FF1, and logic unit signal S2 to FF2. The flip-flops FF1, FF2, and FF3 receive as clock inputs the 100 KHz clock output Q3 of the Mod 12 counter. The respective outputs SQ1, SQ2, SQ3 of the state machine flip-flops are fed back to each of the logic units S0, S1, S2 and to the Preset logic unit P. Logic tables for the state machine coding and the inputs and outputs of the logic units are shown in Table B below. Instead of a hardware implementation of the logic units S0, S1, S2, the state machine may be implemented in a software program that is executed for the clock adjustment function. An example of the PAL logic equations used to program a software implementation of the state machine is provided in Table C below.

The Preset signal is generated when the state machine exits either States 6 or 7, and a logic signal of "1" is generated for SQ0 in State 6 and "0" for State 7. The Preset and SQ0 signals fed back to control the Mod 12 and Mod 10 counters to shorten or lengthen the clock count for the bit cell.

The raw Manchester data is fed to an NRZD logic unit N with the recovered decoding clock from output Q7 of the Mod 10 timer/counter. The NRZD logic unit may be a commercially available unit which employs Exclusive Or-ing, or may be specially programmed to implement another decoding logic for the NRZ data. The decoded NRZ data may then be sent on to a data processor or buffer storage for further use in the receiver system.

The invention thus regenerates a decoding clock that is continuously adjusted to be phase-coherent with the received data signal. The phase coherency is obtained without the need for a separate phase control signal or phase-locked loop control circuitry. The invention is particularly suitable for communication systems which operate in a high phase distortion environment, such as cellular radio. The timebase can be derived from the local oscillator such as used in cellular radio systems. The phase-coherency of the locally generated clock results in bit error rates which readily meet the 1:100 bit error rate standard for such cellular radio systems. The digital state machine implementation also has inherent high-pass filtering through the setting of the sampling of Manchester-encoded data at predetermined count intervals.

Corrections to the Mod 12 counter 40 and the Mod 10 counter 50 are made by logically changing the modulo divides of these counters. If a late correction is necessasry, the preset lead 100 is driven low and the SQ0 lead 110 of the state machine 20 instructs the Mod 12 counter 40 to change to a Mod 8 divide, thus shortening the bit cycle by four oscillator cycles. Normally there are 120 cycles per bit but in the above case, there will only be 116 oscillator cycles in a bit. Thus, the clock is shortened by 1/30th of a bit as illustrated in FIG. 6.

When an early correction is required, the state machine drives the preset lead 100 low and SQ0 lead 110 high. The Mod 12 counter 40 changes to a Mod 4 divide and the Mod 10 changes to a Mod 11 divide. This produces a bit cell with four additional oscillator cycles for a total of 124 cycles per bit or a net incerease of 1/30th of a bit.

This technique of changing the modulo divides on command from the state machine provides a means of determining the required amount of correction for recovering the Manchester clock by simply changing the equations used to program the PALS to implement different modulo divides. Our experiments showed this 1/30th of a bit to be the optimized amount of correction.

This technique also permits changing the equations of the Mod 12 counter to a Mod 15 counter which can be used to recover the Manchester clock for European TACS system. This TACS system encodes the data with an 8 KH clock. The American AMPS system encodes with a 10 KHz clock. The system described herein is primarily for the AMPS system. The 1.2 MHz oscillator provides a time base for both systems. In the AMPS system, the Mod 12 and Mod 10 (divide by 120) yield a 10 KHz clock and the in the TACS system, the Mod 15 and Mod 10 (divide by 1500) yield the 8 KHz clock.

The specific embodiments of the invention described herein are intended to be illustrative only, and many other variations and modifications may be made thereto in accordance with the principles of the invention. All such embodiments and variations and modifications thereof are considered to be within the scope of the invention, as defined in the following claims.

TABLE A

| COUNT | MOD 12 COUNTER | | | | TIMER VALUE |
|---|---|---|---|---|---|
| | Q3 | Q2 | Q1 | Q0 | |
| 0 | 0 | 0 | 0 | 0 | 0 |
| 1 | 0 | 0 | 0 | 1 | 1 |
| 2 | 0 | 0 | 1 | 0 | 2 |
| 3 | 0 | 1 | 1 | 1 | 7 |
| 4 | 0 | 1 | 0 | 0 | 4 |
| 5 | 0 | 1 | 0 | 1 | 5 |
| 6 | 1 | 0 | 1 | 0 | A |
| 7 | 1 | 0 | 1 | 1 | B |
| 8 | 1 | 0 | 0 | 0 | 8 |
| 9 | 1 | 1 | 0 | 1 | D |
| 10 | 1 | 1 | 1 | 1 | E |
| 11 | 1 | 1 | 1 | 1 | F |

| COUNT | MOD 10 COUNTER | | | | TIMER VALUE |
|---|---|---|---|---|---|
| | Q7 | Q6 | Q5 | Q4 | |
| 0 | 0 | 0 | 0 | 0 | 0 |
| 1 | 0 | 0 | 0 | 1 | 1 |
| 2 | 0 | 0 | 1 | 0 | 2 |
| 3 | 0 | 0 | 1 | 1 | 3 |
| 4 | 0 | 1 | 0 | 0 | 4 |
| 5 | 1 | 0 | 0 | 0 | 8 |
| 6 | 1 | 0 | 0 | 1 | 9 |
| 7 | 1 | 0 | 1 | 0 | A |
| 8 | 1 | 0 | 1 | 1 | B |
| 9 | 1 | 1 | 0 | 0 | C |

TABLE B

| | STATE MACHINE CODING | | | |
|---|---|---|---|---|
| STATE | SQ2 | SQ1 | SQ0 | CONDITION |
| 0 | 0 | 0 | 0 | WAIT TO SAMPLE |
| 1 | 0 | 0 | 1 | ILLEGAL * |
| 2 | 0 | 1 | 0 | WAIT FOR 0 TO 1 |

TABLE B-continued

| | | | | |
|---|---|---|---|---|
| 3 | 0 | 1 | 1 | WAIT FOR 1 TO 0 |
| 4 | 1 | 0 | 0 | ON TIME |
| 5 | 1 | 0 | 1 | ILLEGAL |
| 6 | 1 | 1 | 0 | EARLY |
| 7 | 1 | 1 | 1 | LATE |

LOGIC UNITS INPUTS/OUTPUTS

| STATE | PRESENT OUTPUTS | | | NEXT OUTPUTS | | | INPUTS | | | | |
|---|---|---|---|---|---|---|---|---|---|---|---|
| | SQ2 | SQ1 | SQ0 | SQ2 | SQ1 | SQ0 | Q7 | Q6 | Q5 | Q4 | MD |
| 0 | 0 | 0 | 0 | 0 | 0 | 0 | (0 | 0 | 1 | 1) | X |
| | | | | 0 | 1 | 0 | 0 | 0 | 1 | 1 | 0 |
| | | | | 0 | 1 | 1 | 0 | 0 | 1 | 1 | 1 |
| 1 | 0 | 0 | 1 | 0 | 0 | 0 | X | X | X | X | X |
| 2 | 0 | 1 | 0 | 0 | 1 | 0 | | | | | |
| | | | | 1 | 0 | 0 | 0 | 1 | 0 | 0 | 1 |
| | | | | 1 | 1 | 0 | 0 | 0 | 1 | 1 | 1 |
| | | | | 1 | 1 | 1 | 1 | 0 | 0 | 0 | X |
| 3 | 0 | 1 | 1 | 0 | 1 | 1 | | | | | |
| | | | | 1 | 0 | 0 | 0 | 1 | 0 | 0 | 0 |
| | | | | 1 | 1 | 0 | 0 | 0 | 1 | 1 | 0 |
| | | | | 1 | 1 | 1 | 1 | 0 | 0 | 0 | X |
| 4 | 1 | 0 | 0 | 0 | 0 | 0 | 1 | 1 | 0 | 0 | X |
| | | | | 1 | 0 | 0 | (1 | 1 | 0 | 0) | X |
| 5 | 1 | 0 | 1 | 0 | 0 | 0 | X | X | X | X | X |
| 6 | 1 | 1 | 0 | 0 | 0 | 0 | 1 | 1 | 0 | 0 | X |
| | | | | 1 | 1 | 0 | (1 | 1 | 0 | 0) | X |
| 7 | 1 | 1 | 1 | 0 | 0 | 0 | 1 | 1 | 0 | 0 | X |
| | | | | 1 | 1 | 1 | (1 | 1 | 0 | 0) | X |

TABLE C

PAL LOGIC EQUATIONS

STATE MACHINE
;PINS
;
; 1      2      3      4      5      6      7      8      9      10
CLK    MD    RES    NC    NC    /Q4    /Q5    /Q6    /Q7    GND
;11    12    13    14    15    16    17    18    19    20
OE    /PRE    /NVAL    /NRZD    /S2    /S1    /S0    /MDS    NC    VCC
;
;         MANCHESTER DECODER FOR CELLULAR TELEPHONE DATA
;                                  STREAM
;
;
; CLK    AMPS = 100 KHZ ; TACS = 80 KHZ
;
; Q4-Q7    (MOD10) TIMER INPUTS (INVERTED FROM MODMAN)
;          (0-1-2-3-4-8-9-10-11-12)
;
; MD    RAW MANCHESTER DATA INPUT
;
; MDS    SYNC MANCHESTER DATA
;
; PRE    PRESET FOR MODMAN MOD10 TIMER
;        EARLY = 01 LATE = 12
; Sx    STATE FLIP-FLOPS
;
; NRZD    NRZ DATA
;
; RES    RESET FOR SIMULATOR

EQUATIONS
S0  := /S2  */S1 */S0 */Q7 */Q6 * Q5 */Q4 * MDS    */RES;    0 ->3
     + /S2  * S1  *     Q7  */Q6 */Q5 */Q4            */RES;    2 ->7
                                                                3 ->7
     + /S2  * S1  * S0  */Q7 */Q6 * Q5 * Q4 * MDS    */RES;    3 ->3
     + /S2  * S1  * S0  */Q7 * Q6 *           MDS    */RES;    3 ->3
     +  S2  * S1  * S0  *    /Q6 *                    /RES;    7 ->7
S1  := /S2  */S1 */S0 */Q7 */Q6 * Q5 */Q4            */RES;    0 ->2
                                                                0 ->3
     + /S2  * S1  *     Q7  */Q6 */Q5 */Q4            */RES;    2 ->7
                                                                3 ->7
     + /S2  * S1  */S0 */Q7 */Q6 * Q5 * Q4            */RES;    2 ->2
                                                                2 ->6
     + /S2  * S1  */S0 */Q7 * Q6 *           /MDS    */RES;    2 ->2
     +  S2  * S1  *     /Q7                            */RES;    6 ->6
                                                              ;  7 ->7
     +  S2  * S1  *          /Q6                       */RES;
     + /S2  * S1  * S0  */Q7 */Q6 * Q5 * Q4            */RES;    3 ->3

TABLE C-continued
PAL LOGIC EQUATIONS

```
                                                              ;       3 ->6
      + /S2  * S1  * S0  */Q7 * Q6  *             MDS  */RES;         3 ->3
S2   := /S2  * S1  */S0 */Q7 * Q6  */Q5 */Q4 * MDS  */RES;            2 ->4
      + /S2  * S1  */S0 */Q7 */Q6 * Q5  * Q4  * MDS  */RES;           2 ->6
      + /S2  * S1  * S0  */Q7 * Q6  */Q5 */Q4 */MDS  */RES;           3 ->4
      + /S2  * S1  * S0  */Q7 */Q6 * Q5  * Q4  */MDS  */RES;          3 ->6
      + /S2  * S1  *      Q7  */Q6 */Q5 */Q4         */RES;           2 ->7
                                                              ;       3 ->7
      +  S2  *           /Q7                          */RES;          6 ->6
                                                              ;       7 ->7
      +  S2  *           /Q6                          */RES;
NRZD :=                  /Q7 */Q6 */Q5 * Q4  * MDS
      +                   Q7  *                              NRZD
      +                        Q6  *                         NRZD
      +                             Q5  *                    NRZD
      +                                  /Q4 *                NRZD
NVAL :=                   Q7  */Q6 */Q5 * Q4  * MDS   */NRZD
      +                   Q7  */Q6 */Q5 * Q4  */MDS    * NRZD
      +                  /Q7  *                              NVAL
      +                        Q6  *                         NVAL
      +                             Q5  *                    NVAL
      +                                  /Q4 *                NVAL
PRE  :=  S2  * S1  *      Q7  */Q6 * Q5  * Q4  ; PRESET  ONTN    11
MDS  := MD
```

TIMER COUNTERS

```
; 1     2     3     4     5     6     7     8     9     10
CLK   NC    NC    /S0   NC    NC    NC    PRES  NC    GND
;11   12    13    14    15    16    17    18    19    20
OE    /Q7   /Q6   /Q5   /Q4   /Q3   /Q2   /Q1   /Q0   VCC
;              MOD 12 COUNTER 0 1 2 7 4 5 A B 8 D E F
;
;
;       MANCHESTER DECODER TIMER FOR CELLULAR TELEPHONE DATA
;                                 STREAM
;                  FOR BOTH AMPS (10 KHZ) OR TACS (8 KHZ)
;
;    Q0-Q3  MOD 12/15 COUNTER
;    Q4-Q7  MOD 10 COUNTER
;    ANT    AMPS(1) / TACS(0) SELECT
;    PRES   PRESET FROM SECOND PAL STATE MACH
;    S0     STATE BIT 0
```

EQUATIONS

```
;  MOD 12 COUNTER   COUNTER   AMPS ONLY
Q0   :=                                            /Q0
Q1   :=                                      Q1  */Q0
     +                                      /Q1  * Q0
Q2   :=                           /Q3 */Q2 * Q1  */Q0    ; 2
     +                            /Q3 * Q2  */Q1 */Q0    ; 4
     +                            /Q3 * Q2  * Q1  * Q0   ; 7
     +                             Q3 * Q2  */Q1 * Q0    ; D
     +                             Q3 * Q2  * Q1  */Q0   ; E
     +                             Q3 */Q2  * Q1  */Q0   ; 8
     +                             Q3 */Q2  * Q1  */Q0 * /PRES   */S0
;  LATE
Q3   :=                                 Q2 */Q1 * Q0     ; 5 & D
     +                             Q3 * Q2  * Q1 */Q0    ; E
     +                             Q3 */Q2 */Q1 */Q0     ; 8
     +                             Q3 */Q2 * Q1 * Q0     ; B
     +                             Q3 */Q2 * Q1 */Q0     ; A
     +                            /Q3 */Q2 * Q1 */Q0 * /PRES    * S0
;  EARLY
;  MOD 10 COUNTER
Q4   :=           /Q6  *  /Q4 * Q3 * Q2 * Q1 * Q0 *                PRES
     +                    Q4 */Q3
     +                    Q4  *      /Q2
     +                    Q4  *            /Q1
     +                    Q4  *                  /Q0
Q5   :=           /Q6 * Q5 */Q4 * Q3 * Q2 * Q1 * Q0 *              PRES
     +            /Q6 */Q5 * Q4 * Q3 * Q2 * Q1 * Q0 *              PRES
     +                    Q5  * /Q3
     +                    Q5  *      /Q2
     +                    Q5  *            /Q1
     +                    Q5  *                  /Q0
Q6   :=           /Q6 * Q5 * Q4 * Q3 * Q2 * Q1 * Q0 *              PRES
     +                    Q6  * /Q3
     +                    Q6  *      /Q2
     +                    Q6  *            /Q1
     +                    Q6  *                  /Q0
     +                            Q3 * Q2 * Q1 * Q0 * S0          * /PRES
```

TABLE C-continued

PAL LOGIC EQUATIONS

```
;      12-12
Q7  :=   Q7 */Q6 *              Q3 * Q2 * Q1 * Q0 *        PRES
    +   /Q7 * Q6 */Q5 */Q4 * Q3 * Q2 * Q1 * Q0 *        PRES
    +    Q7 *              /Q3
    +    Q7 *                    /Q2
    +    Q7 *                          /Q1
    +    Q7 *                                /Q0
    +                        Q3 * Q2 * Q1 * Q0 * S0      * /PRES
;      12-12
```

I claim:

1. A synchronous digital decoding circuit, for decoding a received Manchester-encoded data signal transmitted with high-to-low and low-to-high transitions at respective center time positions of a series of data bit cells, comprising:

a clock regenerating circuit having a timer/counter unit which provides an output clock of a given number of count pulses for each bit cell of the received data, and a state machine receiving said Manchester-encoded data signal and the output clock of said timer/counter unit, said state machine having first means for detecting whether a transition is in one of on-time, early, and late states with respect to a center time position of the data bit cell, and second means responsive to the detection of the respective states by said first means for providing a correction signal to said timer/counter unit for adjusting the number of clock pulses counted in said output clock for the data bit cell, in order to restore the transitions back toward the center time positions of the data bit cells; and decoding means for decoding the received Manchester-encoded data using the output clock of said timer/counter unit as adjusted by said second means of said state machine.

2. A decoding circuit according to claim 1, wherein said second means of said state machine produces correction signals to said timer/counter unit for the early and late states which are used to shorten and lengthen, respectively, the output clock count for the data bit cell by a predetermined incremental time amount.

3. A decoding circuit according to claim 2, wherein said timer/counter unit includes an input with a timebase oscillator connected thereto and a two-stage counter, said oscillator providing an oscillator input of 1.2 MHz to a modulo 12 counter having its output coupled to a modulo 10 counter, wherein a 100 KHz output is normally provided by said modulo 12 counter to said modulo 10 counter and said state machine, and said output clock is a 10 KHz output clock normally provided by said modulo 10 counter to said state machine and to said decoding means.

4. A decoding circuit according to claim 2, wherein said incremental time amount of adjustment is in the range of 1-6 oscillator pulses out of 120 oscillator pulses for a bit cell.

5. A decoding circuit according to claim 2 and including circuit means, wherein said incremental time amount is subtracted and added from and to a last count increment for the bit cell for the early and late states, respectively.

6. A decoding circuit according to claim 2, wherein said incremental time amount is in the range of 1/120 to 1/20 of the count length of a bit cell.

7. A decoding circuit according to claim 2, wherein said state machine provides a first correction signal indicating that a correction to the clock count is to be carried out and a second signal indicating whether the correction is a subtraction or an addition to the clock count.

8. A decoding circuit according to claim 1, wherein said state machine includes digital logic units which receive output count signals and said output clock from said timer/counter unit and the received Manchester-encoded data signal and generate digital output bits which determine the states of said state machine.

9. A decoding circuit according to claim 1, wherein said state machine includes programmed logic responsive to output count signals and said output clock from said timer/counter unit and the received Manchester-encoded data signal and determine the states of said state machine.

10. A synchronous digital decoding circuit for decoding a received Manchester-encoded data signal transmitted with high-to-low transitions at respective center time positions of a series of data a bit cells comprising a clock regenerating circuit having a timer/counter module which provides an output clock of a given number of pulses in each bit cell, said clock regenerating circuit having an input and an output, an oscillator coupled to the input of said timer/counter module, a state machine coupled to the output of said timer/counter-circuit and receiving said Manchester-encoded data signal, said state machine including an So logic module and an associated FF0 flip flop, an S1 logic module and an associated FF1 flip flop and an S2 logic module and an associated FF2 flip flop, a plurality of inputs and an output on each of said logic modules and a data input, a clock input and a Q output on each of said flip flops, the output of each logic module being connected to the data input of its associated flip flop, a non return to zero data (NRZD) module having two inputs and an output and a flip flop associated with said NRZD module, said flip flop having a data terminal connected to said output terminal of said NRZD module, a clock terminal and an output Q terminal, a preset logic module having plurality of inputs and an output and an associated flip flop having a data terminal, a clock terminal and an output Q terminal, the output of said preset logic module beding connected to sasid data terminal of its associated flip flop, another input of each of said logic modules being connected together to the Q output of said FF0 flip. flop and to one input of said preset logic module, another input of each of said logic modules being connected together to the Q output of said FF1 flip flop and to another input of said preset logic module and another input of each of said logic modules being connected together to the Q output of said FF2 module and to another input of said preset logic module, the outputs of said timer/counter being coupled together and connected to one input of each of said logic modules, a Manchester data input lead connected to another input of each of said logic modules and to an input of said NRZD logic module, a first clock connected to the clock terminals of said FF0, FF1 and FF2 flip flops, and a decoding clock connected to an input of said NRZD logic module and to said clock terminals of said flip flop associated with said NRZD logic module and said flip flop associated with said preset logic module, said Q output of said flip flip associated with said NRZD logic module providing decoded NRZD data and said Q output terminal of said flip flop associated with said preset logic module providing signals indicating that a clock correction is required and the Q output of said FF0 flip flop providing a signal indicating what type of clock correction is to be made.

11. A synchronous digital decoding circuit including
a timer/counter circuit made up of a first counter and a second counter,
an oscillator circuit clock coupled to said first counter and operating in a cycle known as a bit cell and generating a predetermined number of counts in a bit cell,
a state machine coupled to the output of said second counter,
a source of Manchester data signals coupled to said state machine,
means coupling counts generated by said second counter to said state machine,
said state machine comparing said counts with said Manchester data signals and detecting any deviation in the transition of said Manchester data signals from the count representing the center of said bit cell cycle,
said state machine generating a corrective signal, where required by a detected deviation in a bit cell, said corrective signal being coupled to said timer/counter circuit and modifying the clock count for the subsequent bit cell.

12. The method of recovering a clock in a Manchester decoder comprising the steps of
providing a Manchester clock whose period defines a clock period and a bit cell,
counting out a selected number of counts per bit cell,
receiving Manchester data,
comparing the time at which said Manchester data goes through a transition with the number of the count which occurs at the time of the Manchester data transition to define a coincidence time, said coincidence time being either at the center of the bit cell or earlier than the center of the bit cell or later than the center of the bit cell, and
adjusting the length of the clock count of said Manchester clock in accordance with the position of said coincidence time in the bit cell time so that a Manchester data transition occurs at the center of the bit cell time.

13. A synchronous digital decoding circuit for decoding a received Manchester-encoded data signal transmitted with high-to-low and low-to-high transitions at respective center time positions of a series of data bit cells comprising
a clock for generating a series of pulses having a period defined as a bit cell, said pulses having two transitions during the period of a bit cell,
a timer counter module for generating a selected number of pulses in the time duration of the period of a bit cell,
a state machine,
a first input to said state machine from said timer counter module and a a second input to said state machine comprising Manchester data,
means in said state machine for comparing the time of a transition in said Manchester data with the number of pulses generated in a bit cell time to determine the position of said transition with respect to the center of the time duration of the bit cell,
other means in said state machine coupled to said counter timer module for modifying the counting operation thereof to compensate for any deviation of a transition in said Manchester data from the center time of the bit cell, and
an output from said timer counter module providing recovered clock pulses that coincide with transitions of the Manchester data at the center of the period of a bit cell.

* * * * *